(12) United States Patent
Liu et al.

(10) Patent No.: US 7,983,361 B2
(45) Date of Patent: Jul. 19, 2011

(54) CLOCK DATA RECOVERY CIRCUIT

(75) Inventors: Shen-Iuan Liu, Taipei (TW);
Chih-Hung Lee, Chiayi Hsien (TW);
Lan-Chou Cho, Taipei County (TW)

(73) Assignees: Mediatek Inc., Hsin-Chu (TW);
National Taiwan University, Taipei (TW)

( * ) Notice: Subject to any disclaimer, the term of this patent is extended or adjusted under 35 U.S.C. 154(b) by 787 days.

(21) Appl. No.: 11/957,561

(22) Filed: Dec. 17, 2007

(65) Prior Publication Data
US 2008/0267335 A1 Oct. 30, 2008

(51) Int. Cl.
*H04L 27/00* (2006.01)

(52) U.S. Cl. ........ 375/326; 375/327; 375/373; 375/376; 375/293; 327/156; 327/12; 327/157; 327/212; 327/211; 331/57; 331/117 D; 331/108 C; 331/167; 331/187

(58) Field of Classification Search .......... 375/373–376, 375/327, 293, 326; 327/156, 211, 212, 297, 327/12, 57, 298; 329/305, 325, 360, 359; 331/57, 117 D, 108 C, 167, 187, 108 D, 107 DP
See application file for complete search history.

(56) References Cited

U.S. PATENT DOCUMENTS

| | | | | |
|---|---|---|---|---|
| 5,206,607 A * | 4/1993 | Shiga | ............................. | 330/286 |
| 5,557,224 A * | 9/1996 | Wright et al. | .................. | 327/115 |
| 6,807,117 B2 * | 10/2004 | Eguchi | ........................... | 365/201 |
| 6,867,626 B2 * | 3/2005 | Idei | ............................... | 327/141 |
| 7,333,570 B2 * | 2/2008 | Aung et al. | .................... | 375/326 |
| 2005/0206465 A1 * | 9/2005 | Okamoto | .................. | 331/177 V |

* cited by examiner

*Primary Examiner* — Dac V Ha
*Assistant Examiner* — Rahel Guarino
(74) *Attorney, Agent, or Firm* — Thomas|Kayden (57) ABSTRACT

A clock data recovery circuit. The clock data recovery circuit comprises a transmission line, a phase locked loop, a voltage controlled oscillator, a phase selector, and a D flip-flop. The transmission line receives an input signal. The phase locked loop receives the input signal via the transmission line and a reference clock and generates a first clock signal. The voltage controlled oscillator receives the input signal via the transmission line and a control voltage from an internal node of the phase locked loop, and generates a clock signal. The phase selector receives the input signal via the transmission line and the clock signal from the voltage controlled oscillator, and generates a clock output signal. The D flip-flop receives the input signal via the transmission line and the clock output signal, and generates a data output signal.

9 Claims, 11 Drawing Sheets

CLOCK DATA RECOVERY CIRCUIT

BACKGROUND OF THE INVENTION

1. Field of the Invention

The invention relates to a clock data recovery (CDR) circuit and, in particular, to a clock data recovery (CDR) circuit with an LC gated VCO.

2. Description of the Related Art

Some digital data streams, especially high-speed serial data streams (such as a raw data stream from a magnetic head of a disk drive), are transmitted without an accompanying clock. A receiver generates a clock from an approximate reference clock frequency, and then phase-aligns to transitions in the data stream with a phase locked loop. This process is commonly known as clock and data recovery (CDR)

In optical point-to-multipoint communication systems, multi-Gb/s burst-mode clock and data recovery (CDR) circuit plays an important role. For passive optical network (PON) applications, each asynchronous packet has to be correctly received within several tens of bit times. Conventional phase-locked-loop (PLL)-based CDR circuits suffer from the long settling time. Accordingly, a high speed CMOS CDR circuit is highly demanded by a communication system designer.

BRIEF SUMMARY OF THE INVENTION

An embodiment of a clock data recovery circuit comprises a transmission line, a phase locked loop, a voltage controlled oscillator, a phase selector, and a D flip-flop. The transmission line receives an input signal. The phase locked loop receives the input signal via the transmission line and a reference clock and generates a first clock signal. The voltage controlled oscillator receives the input signal via the transmission line and a control voltage from an internal node of the phase locked loop, and generates a clock signal. The phase selector receives the input signal via the transmission line and the clock signal from the voltage controlled oscillator, and generates a clock output signal. The D flip-flop receives the input signal via the transmission line and the clock output signal, and generates a data output signal.

An embodiment of an LC gated voltage controlled oscillator comprises two LC delay stages and a data-triggered multiplexer coupled to the LC delay stages and providing a differential clock signal. The data-triggered multiplexer and one of the LC delay stages collectively form an oscillator according to the input signal.

An embodiment of a phase selector comprises a delay receiving a clock signal, a current mode D flip-flop receiving the clock signal via the delay and an input signal, and a multiplexer receiving the clock signal and an inverted clock signal and selecting one of the clock signal and the inverted clock signal as an output clock signal according to an output signal of the current mode D flip-flop.

The invention provides new architecture of a high speed CMOS CDR circuit. With the new architecture, operating speed of a CDR circuit is increased, power consumption thereof is reduced. In addition, since the architecture is simple, it is very suitable to be realized in CMOS process.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
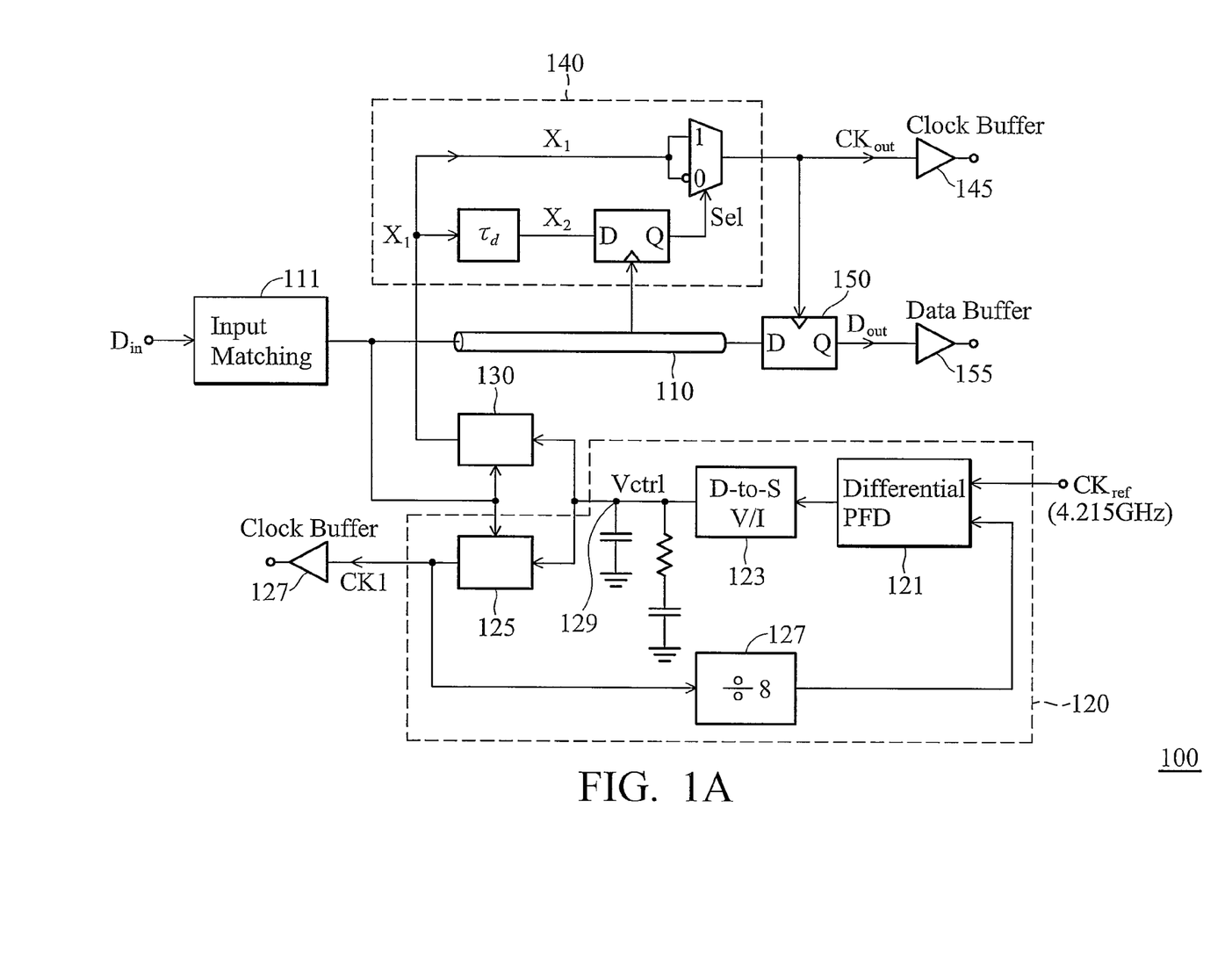
FIG. 1A is a block diagram of a clock data recovery (CDR) circuit according to an embodiment of the invention.
Figure 1B:
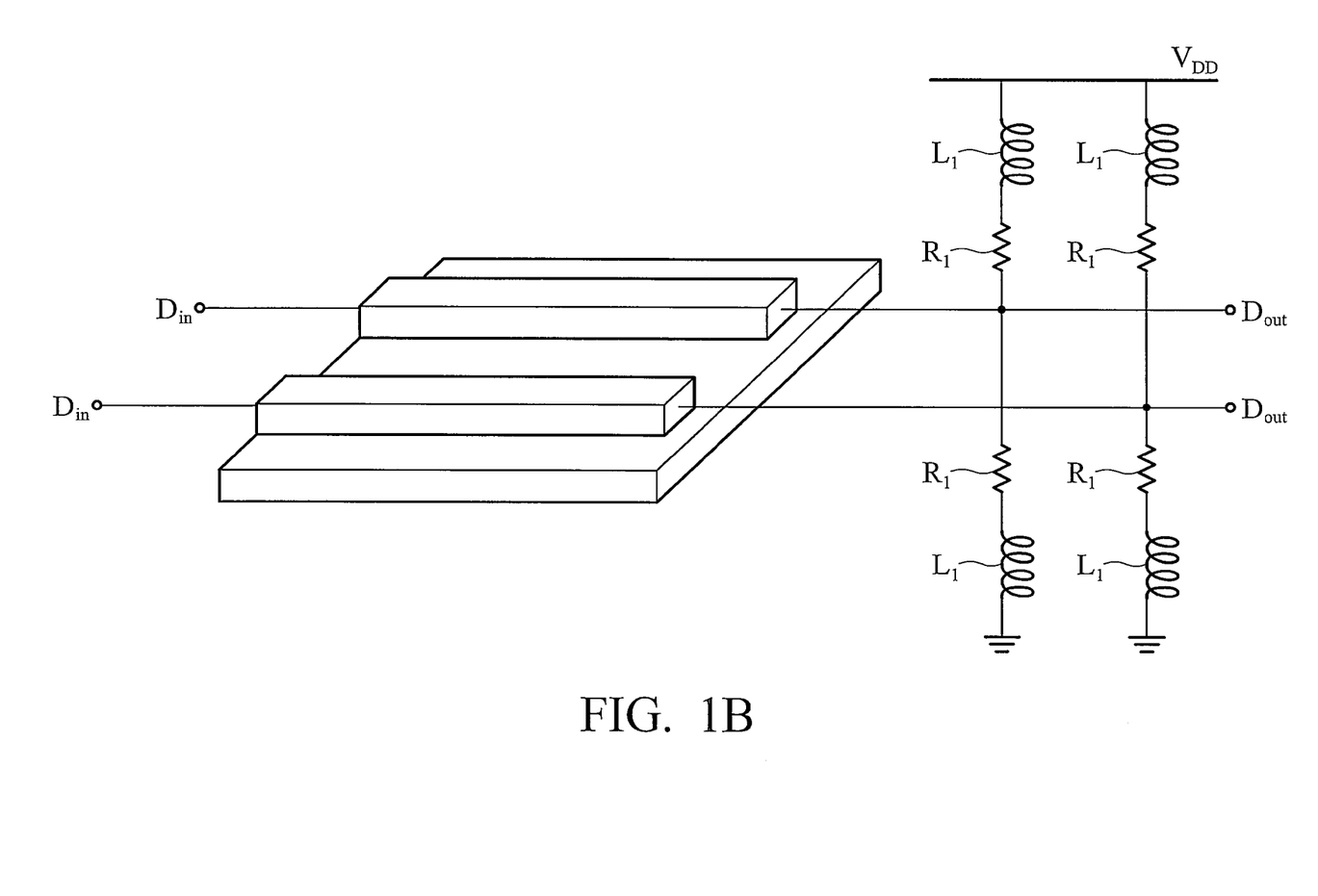
FIG. 1B is a circuit diagram of an embodiment of the input matching circuit 111 in FIG. 1A.

FIG. 1A is a block diagram of a clock data recovery (CDR) circuit according to an embodiment of the invention. The clock data recovery (CDR) circuit 100 comprises a transmission line 110, a phase locked loop 120, a voltage controlled oscillator 130, a phase selector 140, and a D flip-flop 150. The transmission line 110 receives an input signal Din, more specifically, via an input matching circuit 111. FIG. 1B is a circuit diagram of an embodiment of the input matching circuit 111 in FIG. 1A. The input matching circuit 111 in FIG. 1B was disclosed by J. Lee at ISSCC in 2006 and is incorporated as a reference herein. An input symmetric transformer therein is used to absorb pad capacitance. A shunt peaking circuit is realized by two symmetric transformers and resistors to enhance bandwidth. The phase locked loop 120 comprises a differential phase/frequency detector 121, a differential-to-single-ended (D-toS) voltage to current converter 123, a voltage controlled oscillator 125 coupled to the D-toS voltage to current converter 123 via an internal node 129, and a divided-by-8 divider 127. The voltage controlled oscillator 125 of the phase locked loop 120 receives the input signal Din via the transmission line 110 and a control voltage Vctrl from the internal node 129 and generates a first clock signal CK1. The differential phase/frequency detector 121 of the phase locked loop 120 receives a reference clock CKref. The voltage controlled oscillator 130 receives the input signal Din and the control voltage Vctrl from the internal node 129 of the phase locked loop 120, and generates a second clock signal X1. More specifically, the voltage controlled oscillators 125 and 130 are LC gated voltage controlled oscillators. The phase selector 140 receives the input signal Din via the transmission line 110 and the second clock signal X1 from the voltage controlled oscillator 130, and generates a clock output signal CKout. The D flip-flop 150 receives the input signal Din via the transmission line 110 and the clock output signal CKout, and generates a data output signal Dout. Moreover, the clock data recovery (CDR) circuit 100 further comprises a data buffer coupled to the D flip-flop 150 and two clock buffers 127 and 145 respectively coupled to the voltage controlled oscillator 125 and the phase selector 140.

Figure 2A:
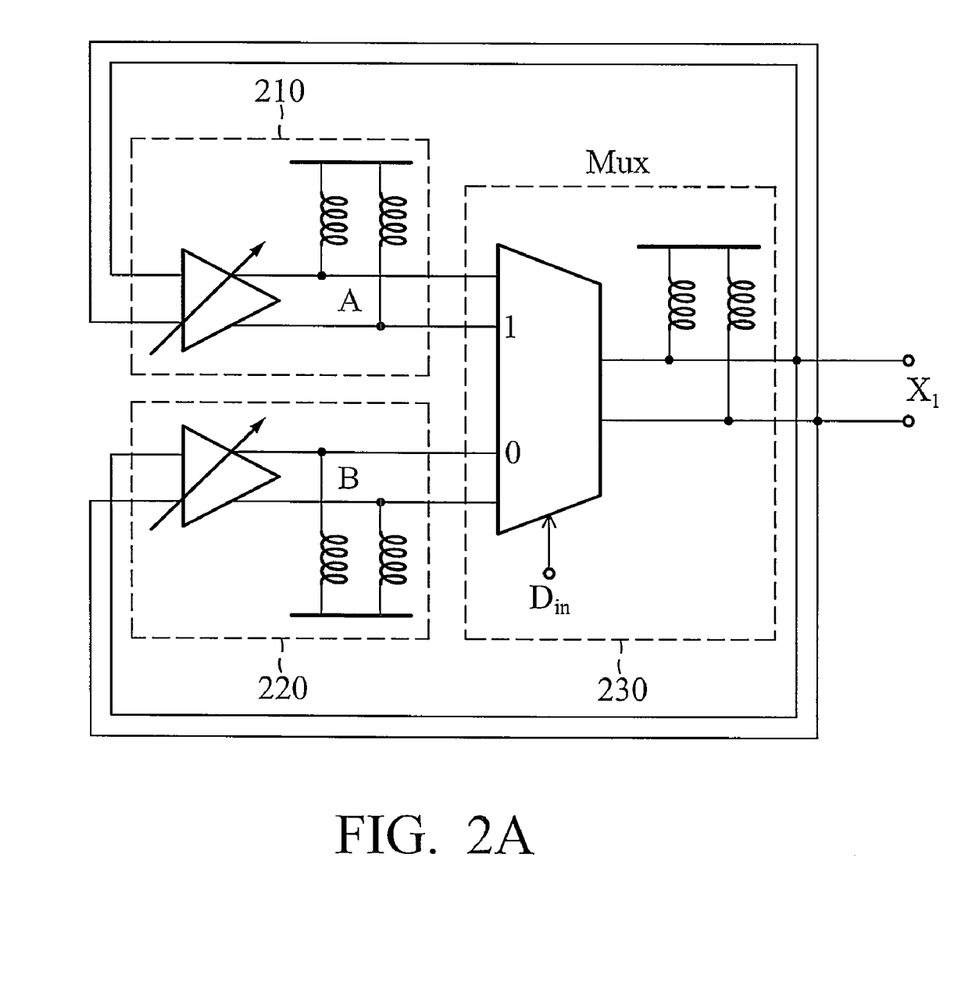
FIG. 2A is a block diagram of an LC gated voltage controlled oscillator in FIG. 1.
Figure 2B:
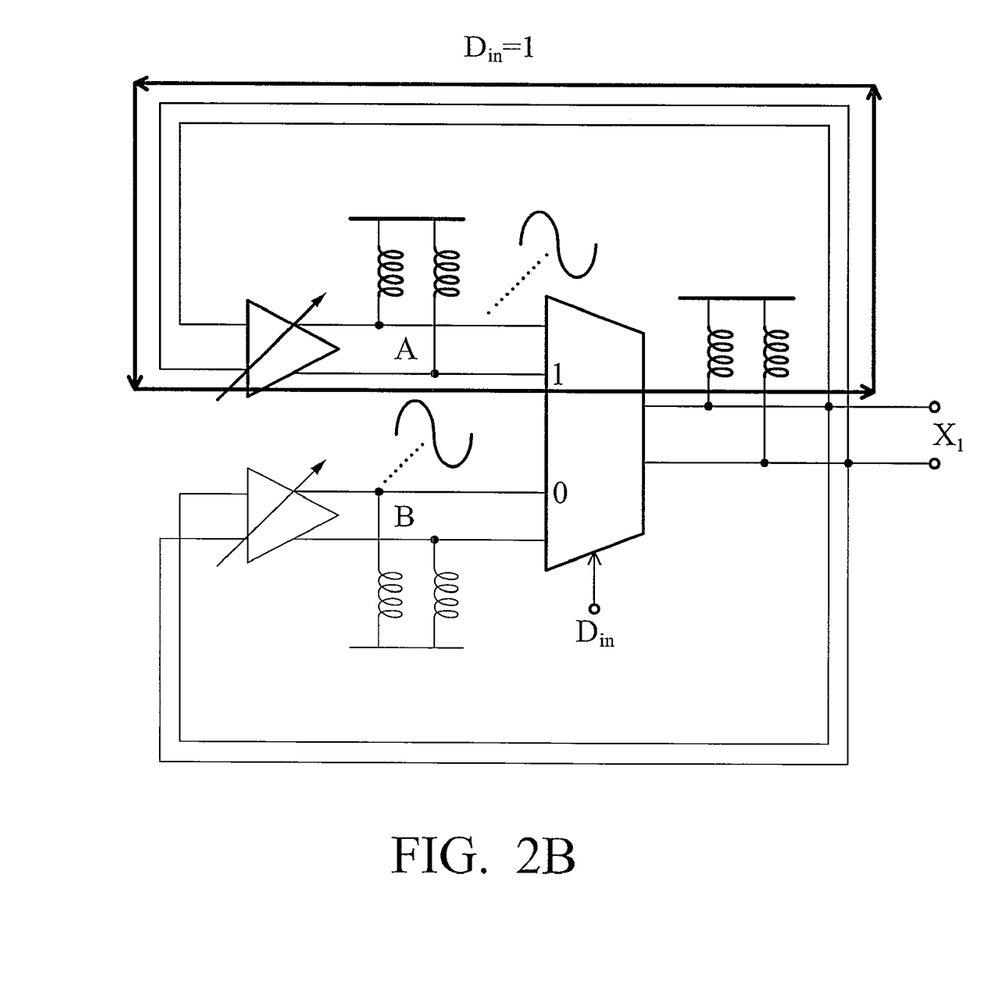
FIGS. 2B, 2C are respectively schematic diagrams of operation of the LC gated voltage controlled oscillator in FIG. 2A when the input signal Din is high and low.
Figure 2C:
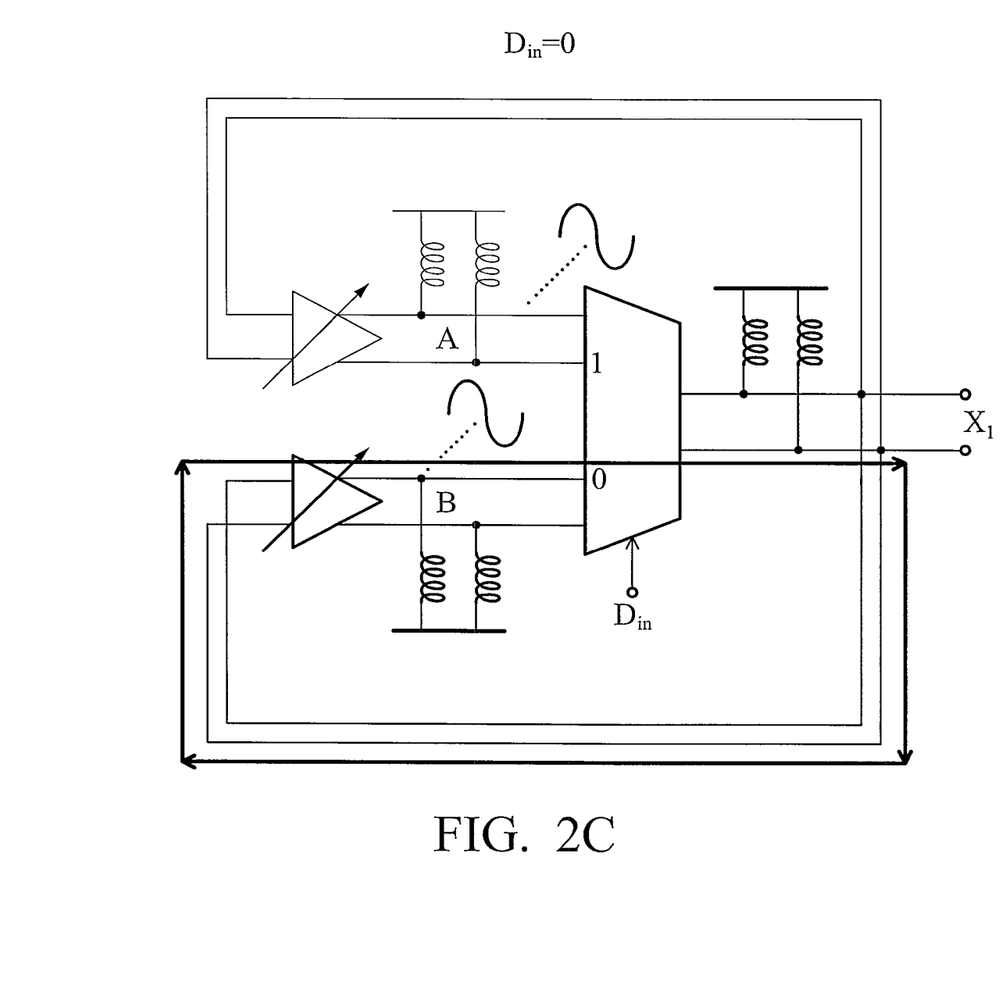

FIG. 2A is a block diagram of an LC gated voltage controlled oscillator in FIG. 1. In FIG. 2A, the LC gated voltage controlled oscillator 200 comprises two LC delay stages 210 and 220 and a data-triggered multiplexer 230 coupled to the LC delay stages 210 and 220. The data-triggered multiplexer 230 provides a differential clock signal X1 to the phase selector 140 in FIG. 1. When the input signal Din is high, the upper LC delay stage 210 and the data-triggered multiplexer 230 collectively form a two-stage LC ring oscillator, as shown in FIG. 2B, and the clocks come from two LC delay stages are in phase. Once the input signal Din changes to low, the lower LC delay stage 220 and the data-triggered multiplexer 230 collectively form another oscillator, as shown in FIG. 2C, and the output of the upper LC stage tracks with that of the lower LC stage. Thus, no oscillator is stopped during the normal operation.

Figure 3A:
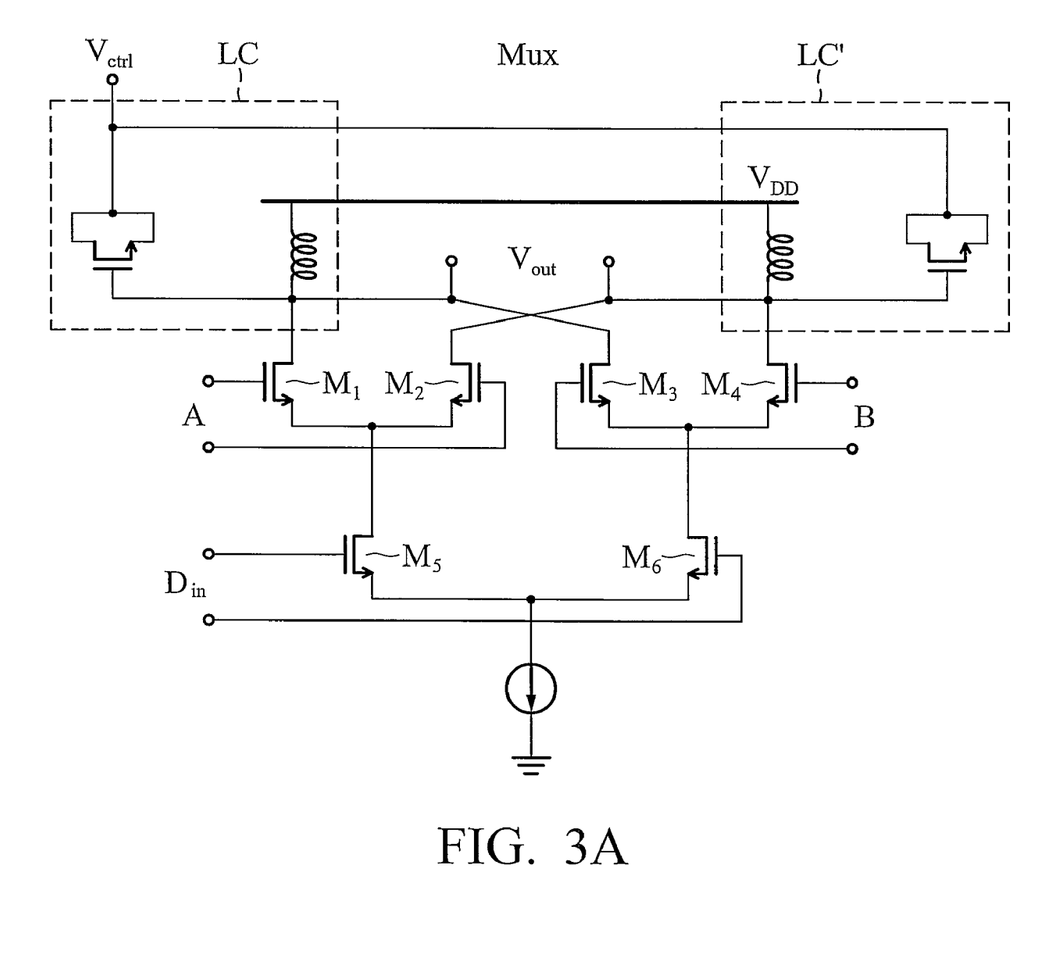
FIG. 3A is a circuit diagram of an embodiment of the data-triggered multiplexer 230 in FIG. 2A.

FIG. 3A is a circuit diagram of an embodiment of the data-triggered multiplexer 230 in FIG. 2A. In FIG. 3A, the data-triggered multiplexer 230 comprises a first pair of MOS transistors M5/M6, a second pair of MOS transistors M1/M2, a third pair of MOS transistors M3/M4, and a pair of LC tanks LC/LC'. The first pair of MOS transistors M5/M6 receive the input signal Din. The second and third pairs of MOS transistors M1/M2 and M3/M4 have sources thereof respectively coupled to one and the other of the first pair of MOS transistors M5/M6. The LC tanks LC/LC' are respectively coupled to the second and third pair of MOS transistors M1/M2 and M3/M4. Gates of the second and third pairs of MOS transistors M1/M2 and M3/M4 respectively receive output signals of one and the other of the LC delay stages. When the input data Din is high, the MOS transistors M3, M4, and M6 are turned off and an equivalent circuit of the data-triggered multiplexer 230 is shown as in FIG. 3B.

Figure 3B:
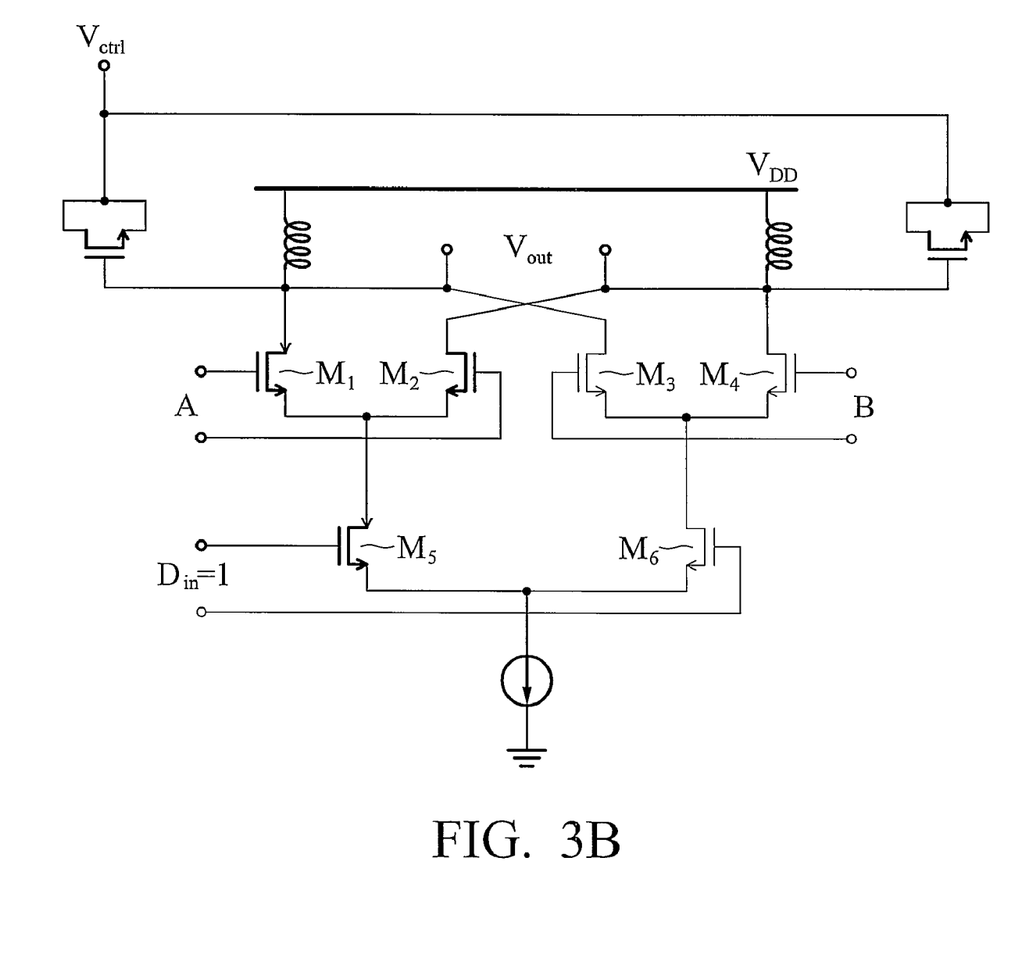
FIG. 3B is an equivalent circuit diagram of the data-triggered multiplexer 230 in FIG. 2A when the input signal Din is high.
Figure 3C:
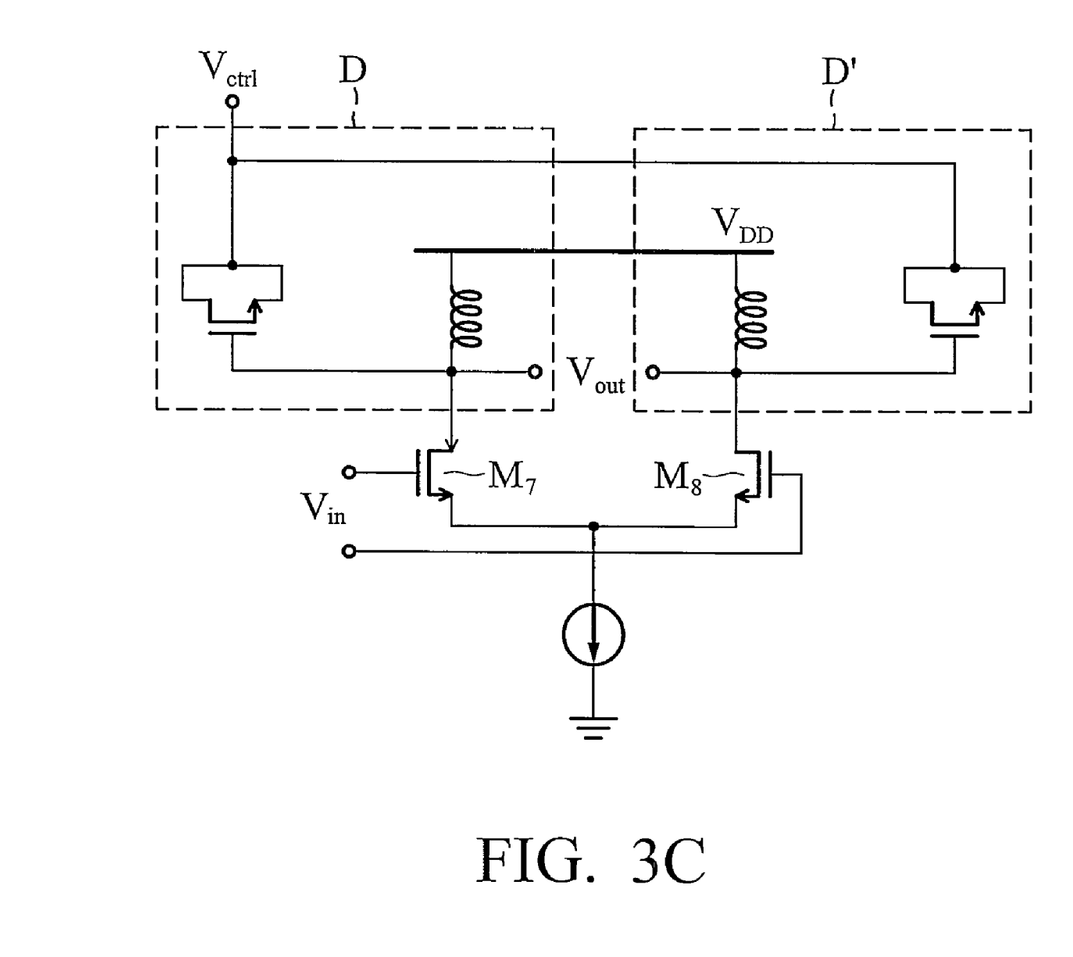
FIG. 3C is a circuit diagram of an embodiment of the LC delay stage 210/220 in FIG. 2A.

FIG. 3C is a circuit diagram of an embodiment of the LC delay stage 210/220 in FIG. 2A. In FIG. 3C, the delay stage 210/220 comprises a pair of MOS transistors M7/M8 and a pair of LC tanks D and D'. The MOS transistors M7/M8 receive the differential clock signal X1 from the data-triggered multiplexer 230 in FIG. 2A. The LC tanks D and D' are respectively coupled to a corresponding MOS transistor M7/M8. In FIG. 3B, the capacitors in the LC tanks D and D' are MOS varactors controlled by a control voltage Vctrl.

Figure 4A:
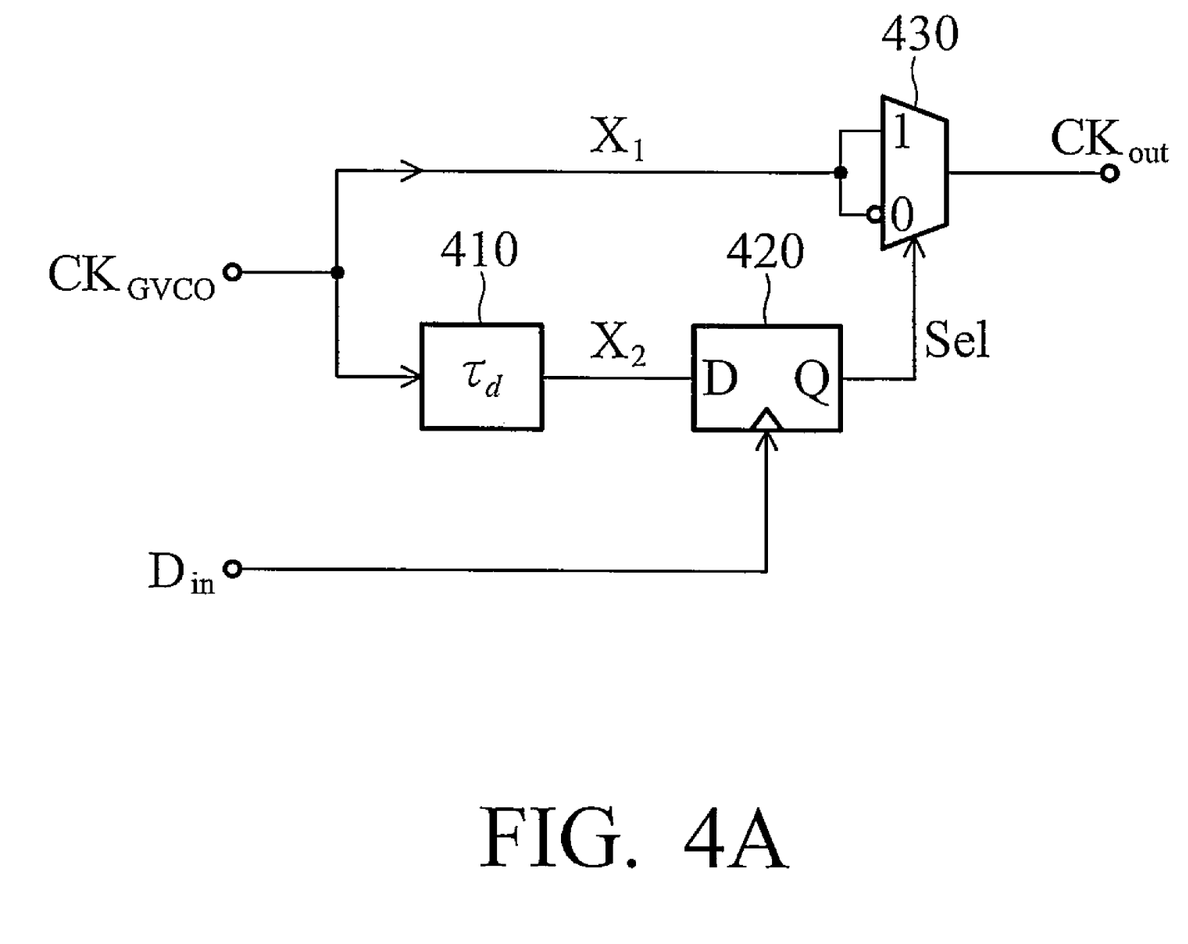
FIG. 4A is a block diagram of an embodiment of the phase selector 140 in FIG. 1A.
Figure 4B:
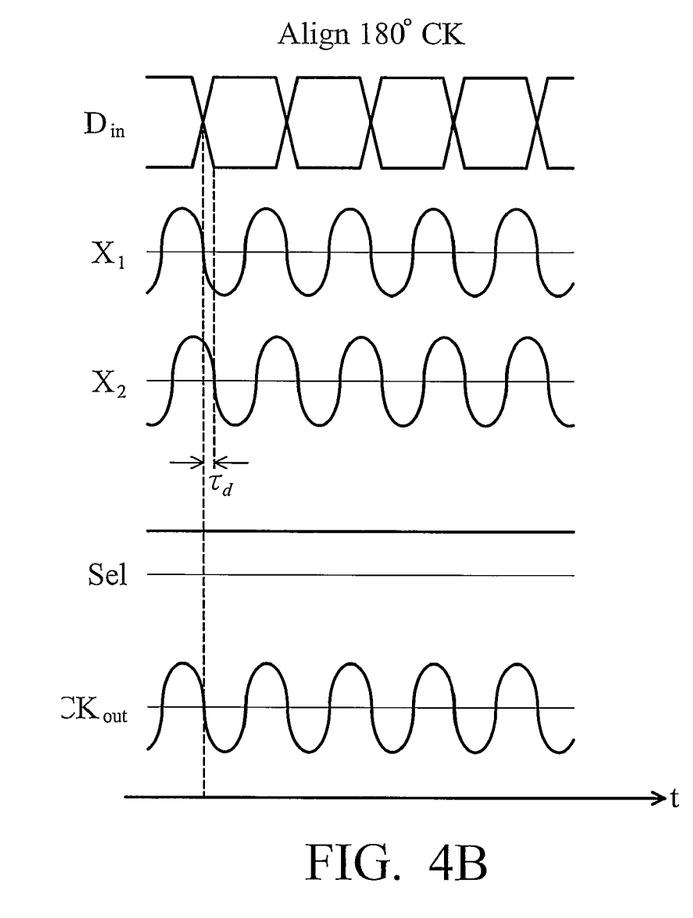
FIGS. 4B and 4C are schematic diagrams showing waveforms of input and output signals of the phase selector in FIG. 4A.
Figure 4C:
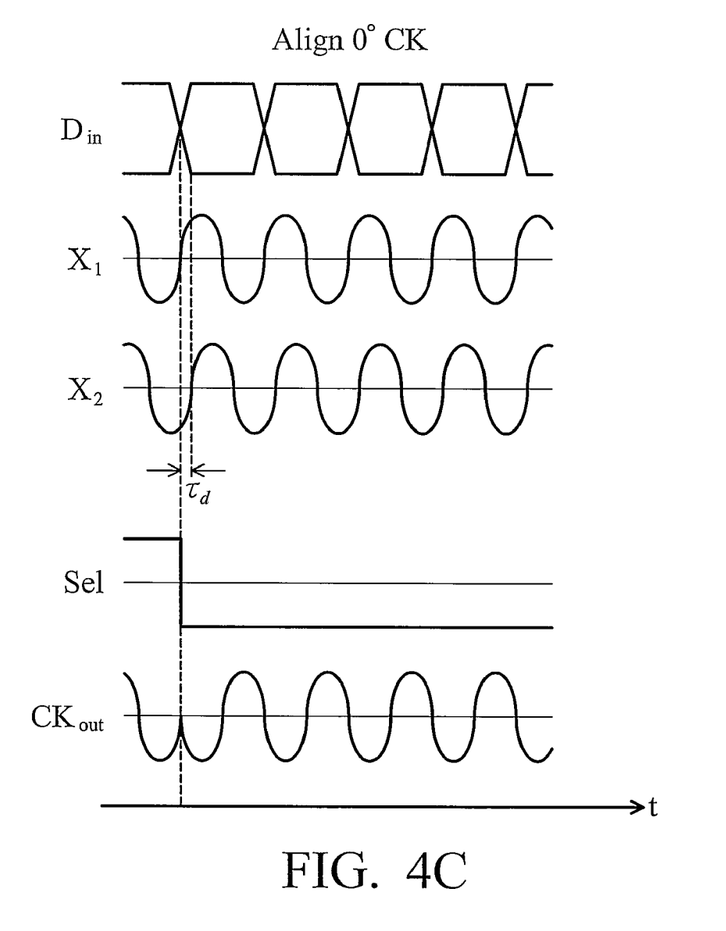

FIG. 4A is a block diagram of an embodiment of the phase selector 140 in FIG. 1A. In FIG. 4A, the phase selector 140 comprises a delay 410, a current mode D flip-flop 420, and a multiplexer 430. The delay 410 receives the second clock signal X1. More specifically, the delay 410 comprises an LC delay stage. The current mode D flip-flop 420 receiving the clock signal X2 via the delay 410 and the input signal Din. The multiplexer 430 receives the second clock signal X1 and an inverted second clock signal $\overline{X1}$ and selects one of the second clock signal X1 and the inverted second clock signal $\overline{X1}$ as the output clock signal CKout according to an output signal of the current mode D flip-flop 420. FIGS. 4B and 4C are schematic diagrams showing waveforms of input and output signals of the phase selector in FIG. 4A. In FIG. 4B, a falling edge of the voltage controlled oscillator 130 locks with the input data Din and an output signal Se1 of the current mode D flip-flop 420 is high. As a result, the rising edge of the voltage controlled oscillator 130 is selected to retime the data, as shown in FIG. 4B. However, if the rising edge of the voltage controlled oscillator 130 locks with the input signal Din, the complementary output $\overline{X1}$ of the voltage controlled oscillator 130 is used to retime the data, as shown in FIG. 4C. While the current mode D flip-flop 420 generates a constant logic high or low, the multiplexer 430 can select the correct clock and retime the data. It is noted that the requirement of the delay 410 is not stringent. The input data Din is allowed to sample the delayed clock X2 far away from clock transitions.

The invention provides new architecture of a high speed CMOS CDR circuit. With the new architecture, operating speed of a CDR circuit is increased, power consumption thereof is reduced. In addition, since the architecture is simple, it is very suitable to be realized in CMOS process.

While the invention has been described by way of example and in terms of preferred embodiment, it is to be understood that the invention is not limited thereto. To the contrary, it is intended to cover various modifications and similar arrangements as would be apparent to those skilled in the Art. Therefore, the scope of the appended claims should be accorded the broadest interpretation so as to encompass all such modifications and similar arrangements.

What is claimed is:

1. A clock data recovery circuit, comprising:
 a transmission line receiving an input signal;
 a phase locked loop receiving the input signal via the transmission line and a reference clock and generating a first clock signal, wherein the phase locked loop comprises a first voltage controlled oscillator controlled by a control voltage from an internal node of the phase locked loop;
 a second voltage controlled oscillator receiving the input signal and the control voltage from the internal node, and generating a second clock signal;
 a phase selector receiving the input signal via the transmission line and the second clock signal from the second voltage controlled oscillator, and generating a clock output signal; and
 a D flip-flop receiving the input signal via the transmission line and the clock output signal, and generating a data output signal.

2. The clock data recovery circuit as claimed in claim 1, wherein at least one of the first and second voltage controlled oscillators comprises an LC gated voltage controlled oscillator.

3. The clock data recovery circuit as claimed in claim 2, wherein the LC gated voltage controlled oscillator comprises two LC delay stages and a data-triggered multiplexer coupled to the LC delay stages, providing a differential clock signal and collectively forming an oscillator with one of the LC delay stages according to the input signal.

4. The clock data recovery circuit as claimed in claim 3, wherein each delay stage comprises a pair of MOS transistors receiving the differential clock signal and a pair of LC tanks coupled to a corresponding MOS transistor, wherein capacitors in the LC tanks are controlled by a control voltage.

5. The clock data recovery circuit as claimed in claim 3, wherein the data-triggered multiplexer comprises a first pair of MOS transistors receiving the input signal, second and third pairs of MOS transistors having sources thereof respectively coupled to one and the other of the first pair of MOS transistors, and a pair of LC tanks respectively coupled to the second and third pair of MOS transistors, wherein gates of the second and third pairs of MOS transistors respectively receive output signals of one and the other of the LC delay stages.

6. The clock data recovery circuit as claimed in claim 1, wherein the phase selector comprises a delay receiving the second clock signal, a current mode D flip-flop receiving the second clock signal via the delay and the input signal, and a multiplexer receiving the second clock signal and an inverted second clock signal and selecting one of the second clock signal and the inverted second clock signal as an output clock signal according to an output signal of the current mode D flip-flop.

7. The clock data recovery circuit as claimed in claim 1, further comprising an input matching circuit coupled to the transmission line.

8. The clock data recovery circuit as claimed in claim 1, further comprising a data buffer coupled to the D flip-flop.

9. The clock data recovery circuit as claimed in claim 1, further comprising two clock buffers respectively coupled to the phase selector and the phase locked loop.

* * * * *